United States Patent
Thommana et al.

(10) Patent No.: US 11,367,499 B2
(45) Date of Patent: Jun. 21, 2022

(54) MITIGATING SINGLE-EVENT UPSETS USING CONTAINERIZATION

(71) Applicant: Rockwell Collins, Inc., Cedar Rapids, IA (US)

(72) Inventors: John V. Thommana, Cedar Rapids, IA (US); Chris K. Ridgway, Marion, IA (US); Joseph Kaemmer, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/005,808

(22) Filed: Aug. 28, 2020

(65) Prior Publication Data

US 2022/0068421 A1   Mar. 3, 2022

(51) Int. Cl.
*G11C 29/38* (2006.01)
*G06F 12/02* (2006.01)
(Continued)

(52) U.S. Cl.
CPC .......... *G11C 29/38* (2013.01); *G06F 11/1004* (2013.01); *G06F 12/0223* (2013.01); *G11C 29/44* (2013.01); *G06F 2212/1032* (2013.01)

(58) Field of Classification Search
None
See application file for complete search history.

(56) References Cited

U.S. PATENT DOCUMENTS 5,155,844 A * 10/1992 Cheng ................. G06F 11/2273
714/36
6,064,859 A    5/2000 Leopold et al.
(Continued)

FOREIGN PATENT DOCUMENTS

CN    105005453 A  * 10/2015
CN    108832990 A    11/2018
(Continued)

OTHER PUBLICATIONS (Rahman et al.), "A Service Framework for Parallel Test Execution on a Developer's Local Development Workstation", IEEE, (2015) (Year: 2015).*

(Continued)

*Primary Examiner* — April Y Blair
*Assistant Examiner* — Matthew W Wahlin
(74) *Attorney, Agent, or Firm* — Suiter Swantz pc llo

(57) ABSTRACT

A computing system is disclosed. The computing system includes a computation unit, one or more processors, a volatile memory, and a non-volatile memory communicatively coupled to the one or more processors and having instructions stored thereon, which when executed by the one or more processors, causing the one or more processor to instantiate a container and perform at least one of a volatile memory checking procedure or a non-volatile memory checking procedure. The volatile memory checking procedure includes checking the first physical address space for errors, loading a container into volatile memory containing the first physical address space if an error is determined, rechecking the first physical address space for error, loading the container to a second physical address space and updating a memory management unit if an error in the first physical address space is determined.

15 Claims, 6 Drawing Sheets

(51) Int. Cl.
*G06F 11/10* (2006.01)
*G11C 29/44* (2006.01)

(56) References Cited

U.S. PATENT DOCUMENTS

| | | | |
|---|---|---|---|
| 7,620,883 | B1 | 11/2009 | Carmichael et al. |
| 9,003,252 | B1* | 4/2015 | Aharoni ................ G11C 29/76 |
| | | | 714/733 |
| 9,043,638 | B1 | 5/2015 | Su et al. |
| 9,912,323 | B1 | 3/2018 | Ardalan |
| 10,243,650 | B2 | 3/2019 | Buehler et al. |
| 10,637,562 | B1 | 4/2020 | Cleave et al. |
| 10,659,564 | B2 | 5/2020 | Coleman et al. |
| 2002/0053008 | A1* | 5/2002 | Goodman ........... G06F 11/1417 |
| | | | 711/162 |
| 2011/0012638 | A1 | 1/2011 | Shuler, Jr. |
| 2015/0169223 | A1* | 6/2015 | Srikantaiah ......... G06F 12/1081 |
| | | | 711/147 |
| 2015/0186214 | A1 | 7/2015 | Gladwin et al. |
| 2016/0248631 | A1 | 8/2016 | Duchesneau |
| 2017/0054492 | A1 | 2/2017 | Buehler et al. |
| 2019/0108116 | A1 | 4/2019 | Benes et al. |
| 2019/0227810 | A1* | 7/2019 | Jacquin ................... G06F 9/30 |

FOREIGN PATENT DOCUMENTS

| | | |
|---|---|---|
| CN | 110690917 A | 1/2020 |
| WO | 2019057302 A1 | 3/2019 |

OTHER PUBLICATIONS

Hill, Jeffrey, "Lockheed Martin Accelerates Transition to Software-Defined Space", URL:https://www.satellitetoday.com/innovation/2019/03/21/lockheed-martin-accelerates-transition-to-software-defined-space/, Lockheed Martin, Mar. 21, 2019, pp. 1-5.
Extended Search Report in European Application No. 21192660.5 dated Feb. 10, 2022, 7 pages.

* cited by examiner

MITIGATING SINGLE-EVENT UPSETS USING CONTAINERIZATION

BACKGROUND

Satellites orbiting the earth are bombarded by ionizing particles that can disrupt or damage micro-circuitry, resulting in temporary or permanent damage to the electronic system of the satellite. To prevent this, satellites have traditionally implemented hardening, ruggedizing, and redundancy engineering techniques when developing satellite electronic systems. These hardening, ruggedizing, and redundancy techniques are time and cost intensive, often causing satellite development projects to become delayed and/or over budget. Thus, it is desirable to provide a system or method that avoids the shortcomings of conventional approaches.

SUMMARY

A computing system is disclosed. In one or more embodiments, the computing system includes a computation unit. The computation unit includes one or more processors. The computation unit further includes a volatile memory. The computation unit further includes a non-volatile memory communicatively coupled to the one or more processors and having instructions stored thereon, which when executed by the one or more processors, causing the one or more processor to instantiate a container and perform a volatile memory checking procedure to check the volatile memory for errors. The volatile memory checking procedure includes checking a first physical address space of the volatile memory for errors, wherein the first address space is configured to store a portion of the container. The volatile memory checking procedure further includes loading at least one of the container or a test pattern into volatile memory that includes the first physical address space when an error is determined in the first address space. The volatile memory checking procedure further includes rechecking the first physical address space for errors. In one or more embodiments, the volatile memory checking procedure further includes designating the first physical address space as a faulty physical address space when an error is determined in the first physical address space, which includes updating a memory management unit corresponding to the first physical address space designating the first physical address space as faulty and updating a memory management file stored in non-volatile memory designating the first physical address space as faulty. The volatile memory checking procedure further includes loading the container into a second physical address space.

In some embodiments of the computing system, the computing system further comprises a transceiver communicatively coupled to the computation unit.

In some embodiments of the computing system, the computing system is disposed within a satellite.

In some embodiments of the computing system, the container is a component of a microservice architecture.

In some embodiments of the computing system, checking the first physical address space of the volatile memory for errors comprises a cyclic redundancy check.

In some embodiments of the computing system, reloading the container into the first physical address space occurs without rebooting the computing system.

In some embodiments of the computing system, the computing system is ruggedized against single-event effects.

In some embodiments of the computing system, the first physical address space and the second physical address space are located on separate volatile memory units.

A computing system is also disclosed. In one or more embodiments, the computing system includes a computation unit. The computation unit includes at least one processor. The computation unit further includes a volatile memory. The computation unit further includes a non-volatile memory communicatively coupled to the one or more processors and having instructions stored thereon, which when executed by the one or more processors, causing the one or more processor to instantiate a container; and perform a non-volatile memory checking process to check the non-volatile memory for errors. The non-volatile memory checking process includes checking a first memory block of the non-volatile memory for errors, wherein the first memory block stores an image of the container. In some embodiments, the non-volatile memory checking process includes checking the integrity of one or more backup copies of the image of the container when an error in the first memory block is determined. The non-volatile memory checking process includes loading at least one of an image of the container from one of the one or more backup copies of the image of the container, or a test pattern, or to the first memory block when an error is determined in the first memory block. The non-volatile memory checking process includes rechecking the first memory block for errors. The non-volatile memory checking process further includes loading one of the one or more backup copies of the image of the container to a second memory block when an error is determined in the first memory block. The non-volatile memory checking process further includes designating the first memory block as faulty.

In some embodiments of the computing system, the computing system further comprises a transceiver communicatively coupled to the computation unit.

In some embodiments of the computing system, the computing system is disposed within a satellite.

In some embodiments of the computing system, the container is a component of a microservice architecture.

In some embodiments of the computing system, checking a first memory block of the non-volatile memory for errors comprises a cyclic redundancy check.

In some embodiments of the computing system, checking a first memory block of the non-volatile memory for errors further comprises the use of voting logic.

In some embodiments of the computing system, the computing system is ruggedized against single-event effects.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
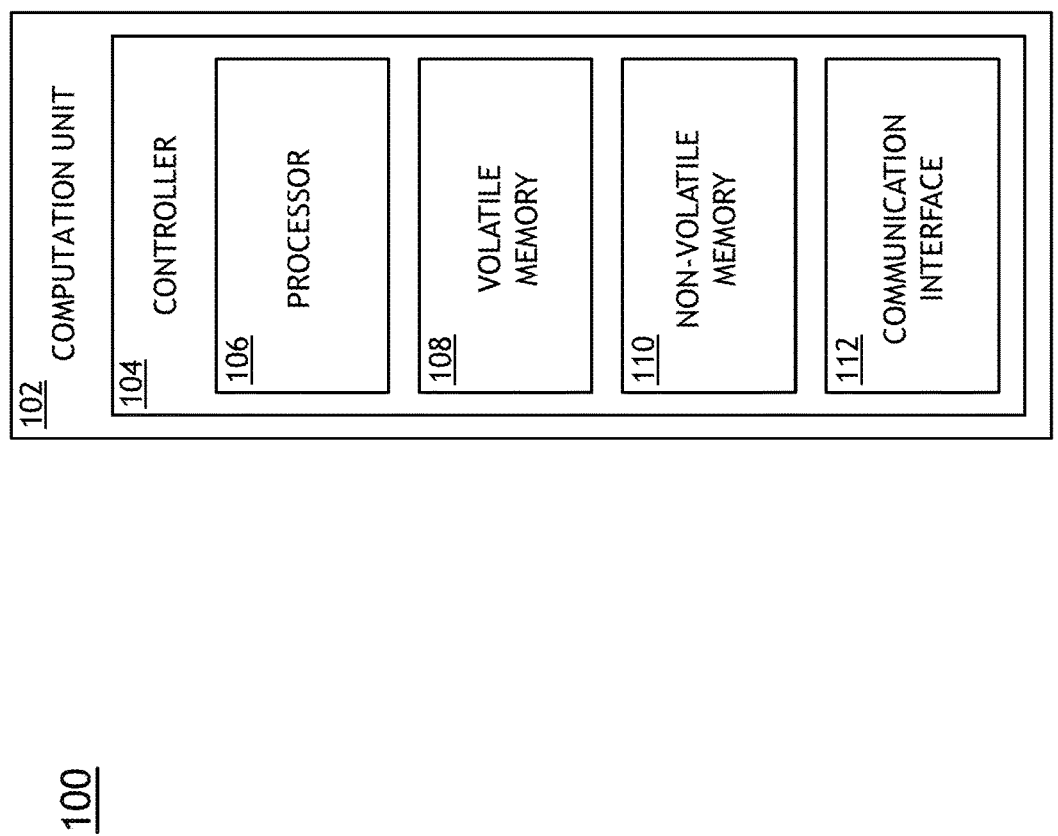
FIG. 1 is a block diagram illustrating a computing system, in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

FIGS. 1 through 4B generally illustrate a containerized computing system within a microservice architecture configured for recovering from errors that may occur within memory within volatile and/or non-volatile memory components. Electronic componentry designed for satellite systems have traditionally been ruggedized, or hardened, in order to survive the space environment. While in orbit highly energized particles (e.g., cosmic rays or protons) can interact with electronic componentry causing temporal or permanent damage. Temporal damage resulting in a single-upset event (e.g., causing an error in an executable program loaded into random access memory (RAM) may require an entire system to reboot. Permanent damage, (e.g., a destructive latch-up, burn-out, or gate rupture), may entirely disable a system.

Communication software deployed in traditional satellite systems is packaged as monolithic blocks that are encrypted and signed. Each monolithic block typically includes a customized operating system, platform software, and all of the waveform applications the supported by the receiving device (e.g., receiver, transceiver, or radio). In these traditional systems, transceivers have the capability to dynamically load and unload waveform applications only.

In order to combat the negative effects of operating in space, a containerized computing system utilizing microservice architecture, partial-memory reconfiguration, and fault detection techniques is disclosed. The computing system is novel low-cost rapid-deployment solution as compared to traditional system. The computing system allows for rapid recovery from transient single event upsets, as well as permanent effects such as latch-up, burn-outs and gate rupture.

FIG. 1 is a block diagram, illustrating a computing system 100, in accordance with one or more embodiments of the disclosure. In embodiments, the computing system includes at least one computation unit 102. The computation unit 102 may be configured for any purpose known in the art. For example, the computation unit 102 may be computational circuitry for a receiver or a transceiver (e.g., the computing system includes a computation unit 102 communicatively coupled to a transceiver). In another example, the computation unit may be computational circuitry for a navigational system.

In embodiments, the computation unit 102 may be configured for use in any environment. For example, the computation unit 102 may be configured for use in a satellite. For instance, the computation unit 102 may be configured for use in a low Earth orbit (LEO) satellite (e.g., such as a transceiver for a LEO satellite).

In embodiments, the computation unit includes respective hardware, software, and/or firmware configured to execute the various functions or steps described herein. For example, each computation unit 102 may include at least one controller 104 being in communication with the computing system 100. The controller 104 is configured to receive, process, and transmit data within the computing system 100. The controller 104 includes one or more processors 106 configured to perform functions or steps according to program instructions stored in a volatile memory 108 or non-volatile memory 110. The controller 104 is further configured to include a communication interface 112. The communication interface 112 is configured to facilitate data transfer data between components of the computation unit and/or other componentry within the computing system 100.

The one or more processors 106 may include any type of processing elements, including but not limited to integrated circuits (e.g., application specific integrated circuits (ASIC) and field programmable gate arrays (FPGA). The one or more processors 106 may separately or collectively perform the functions and/or steps as described herein. The volatile memory 108 or non-volatile memory 110 may also include resident or external memory for storing data, executable code, and other resident or external memory generated by the system 100. The controller 104 can execute one or more software programs embodied in a non-transitory computer readable medium (e.g., non-volatile memory 110) that implement techniques described herein. In some embodiments, the controller 104 is not limited by the materials from which it is formed or the processing mechanisms employed therein and, as such, can be implemented via semiconductor(s) and/or transistors (e.g., using electronic integrated circuit (IC) components), and so forth.

The volatile memory 108 and/or non-volatile memory 110 can be an example of tangible, computer-readable storage medium that provides storage functionality to store various data and/or program code associated with operation of the computing system 100 and/or controller 104 such as software programs and/or code segments, or other data to instruct the controller 104 and possibly other components of the computing system 100, to perform the functionality described herein. Thus, the volatile memory 108 and/or non-volatile memory 110 can store data, such as a program of instructions for operating the controller 104 and other components of the computing system 100. The memory can be integral with the controller 104, can comprise stand-alone memory, or can be a combination of both. Some examples of the volatile memory 108 and/or non-volatile memory 110 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 112 can be operatively configured to communicate with componentry within the computation unit 102. For example, the communication interface 112 may be configured to retrieve data from the controller 104, transmit data for storage in the volatile memory 108 and/or non-volatile memory 110, retrieve data from storage in the volatile memory 108 and/or non-volatile memory 110, and so forth. The communication interface 112 can also be communicatively coupled with the controller 104 to facilitate data transfer between components of the computing system 100 and the controller 104.

It should be noted that while the communication interface 112 is described as a component of the computation unit 102, one or more components of the communication interface 112 may be implemented as external components communicatively coupled to the computation unit 102, the first remote device 120 and/or other components of the computing system 100 via a wired and/or wireless connection.

Figure 2:
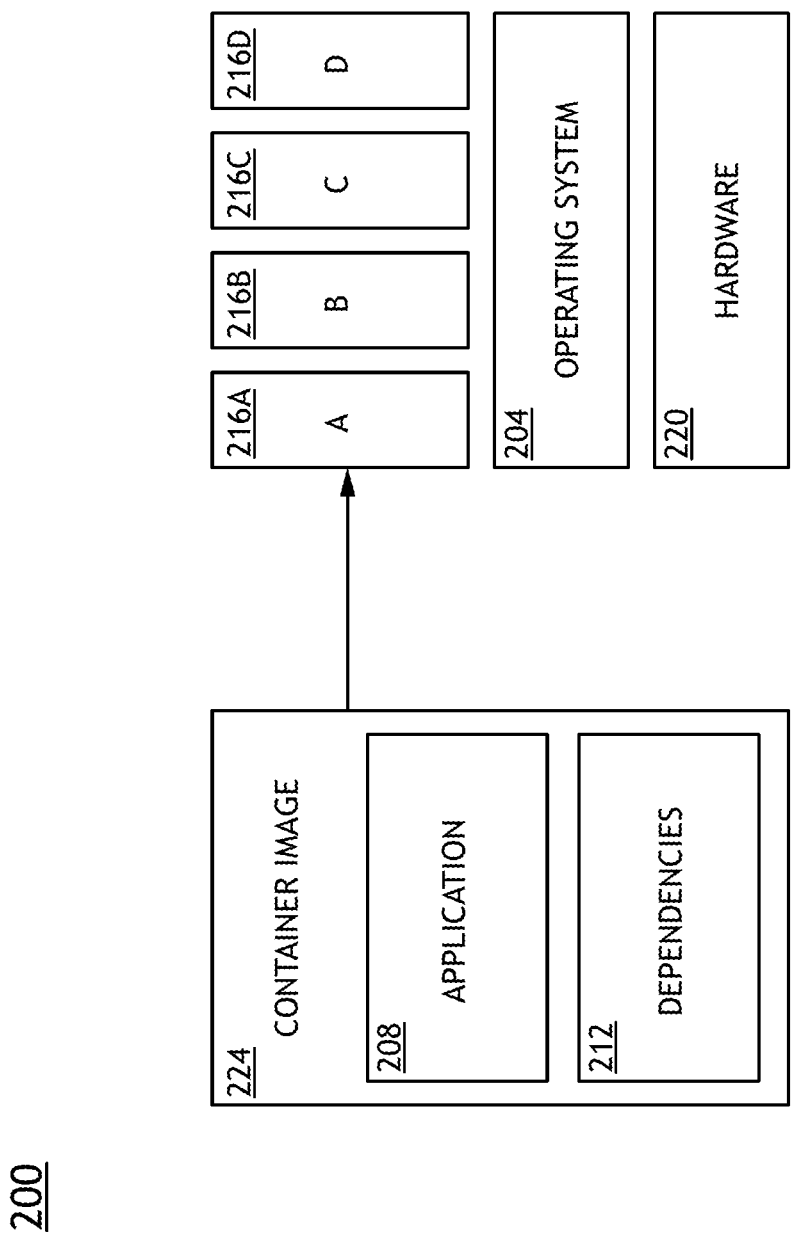
FIG. 2 is a block diagram illustrating a container architecture for a computing system, in accordance with one or more embodiments of this disclosure.

FIG. 2 is a block diagram illustrating the containerized architecture 200 of the computing system 100 with a containerized architecture, in accordance with one or more embodiments of this disclosure. Containerization is a form of a virtualization of an operating system 204 through which applications 208 are run in isolated user spaces called containers 216a, 216b, 216c, 216d. Two or more containers 216 may use the same operating system 204 that is run by the computer hardware 220. Everything that the application 208 needs to run (e.g., binaries, libraries, configuration files and dependencies 212) is encapsulated and isolated in its respective container 216. A container image containing the application 208, dependencies, 212, and other related data are stored as non-volatile memory 110, and are loaded into volatile memory 108 for execution by the one or more processors 106 (e.g., the one or more processors 106 instantiate the container).

In embodiments, the container is a component of a microservice architecture. Generally, a microservice architecture employs services that are independently employable. Many components within a microservice architecture are encapsulated within a container 216. For example, a computing system 100 utilizing a microservice architecture may have one or more containers 216 that encapsulate a component of an application, wherein the multiple containers 216 are each independently deployable. The ability of a microservice architecture to parse an application into independent, loosely-coupled, individually deployable containers 216 allow for increased flexibility in application delivery, updating, and error correction.

In some embodiments, componentry within the computing system 100 is ruggedized against single-event effects. Generally, single-event effects refer to a change in state caused by a single ionizing particle (ion, electron, photon, etc.) striking an electronic device and include non-permanent single-event upsets (e.g., soft errors) and permanent damage (e.g., in the form of single-event gate ruptures, single-event latch-ups, and single-event burnouts). For example, the computing system 100 may include componentry resistant to cosmic rays and high energy protons. Different levels of ruggedization within the computing system 100 may be employed. For example, a low earth orbit (LEO) satellite may employ a computing system 100 with a low level of ruggedization. In another example, a high earth orbit satellite may employ a computing system 100 with a high level of ruggedization.

Figure 3A:
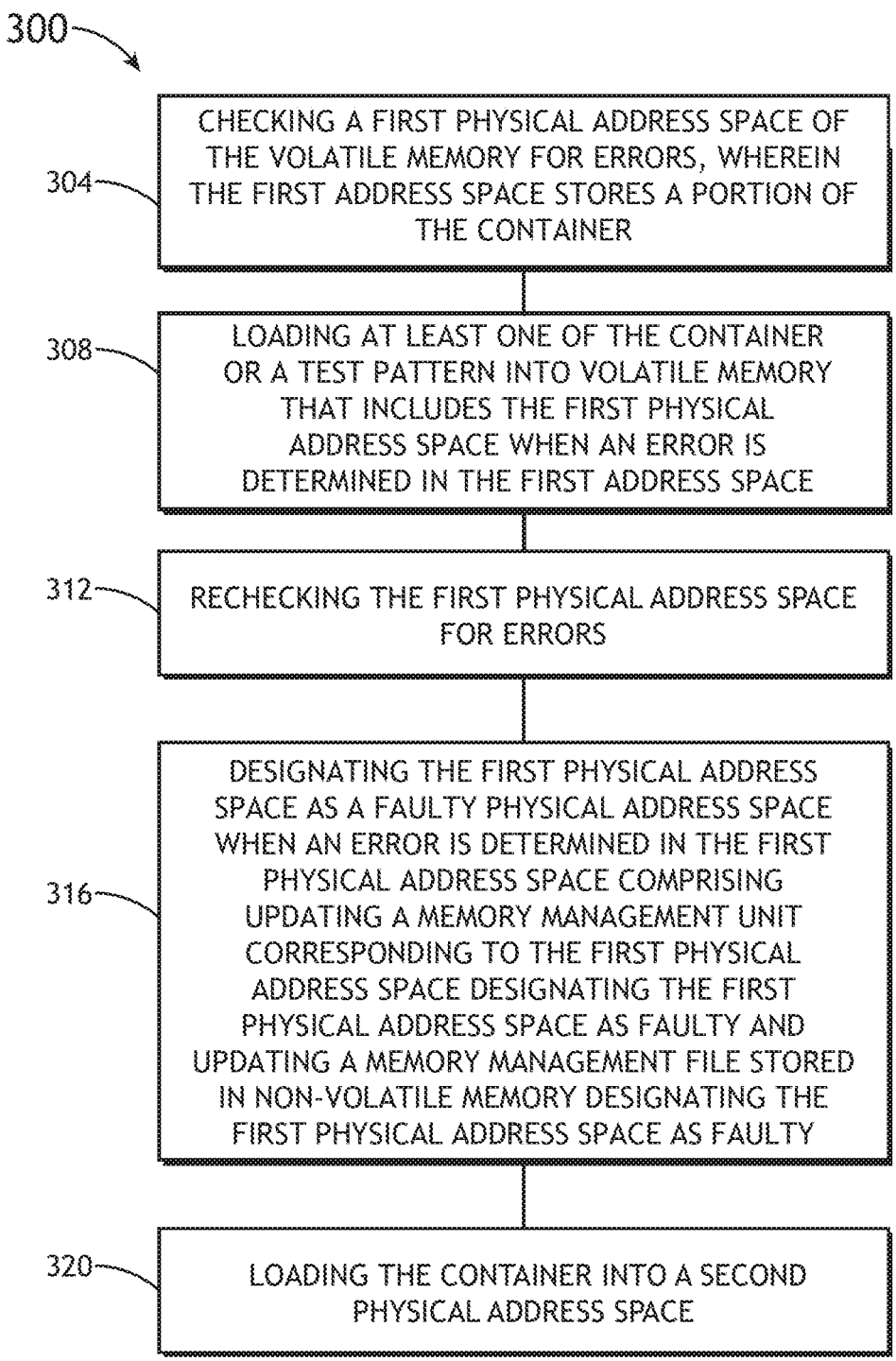
FIG. 3A is a flow diagram illustrating an error checking process, in accordance with one or more embodiments of this disclosure.

FIG. 3A is a flow diagram illustrating a volatile memory checking process 300 for the volatile memory 108 of the computing system 100, in accordance with one or more embodiments of this disclosure. The volatile memory checking process 300 is configured to periodically check containers 216 that have been loaded into volatile memory 108 for errors. The errors may comprise soft errors (e.g., a single event upset) or a permanent error (e.g., a single-event gate rupture or single-event burnout).

In embodiments, the volatile memory checking process 300 is performed by the one or more processors 106 within the computation unit 102. For example, the volatile memory checking process 300 may be performed by one or more processors 106 operating within the same operating system (e.g., a primary operating system) and/or on a same processing core as the one or more processors 106 used for executing stored instructions of one or more containers 216 of the containerized architecture 200 within the computing system 100. In another example, the volatile memory checking process 300 may be performed by one or more processors 106 operating within a different operating system (e.g., a monitoring operating system) and/or processing core as the one or more processors 106 used for executing the one or more containers 216 of the containerized architecture 200 within the computing system 100. For instance, the monitoring operating system and the primary operating system and the primary operating system may compare data and/or signals sent to each other.

Figure 3B:
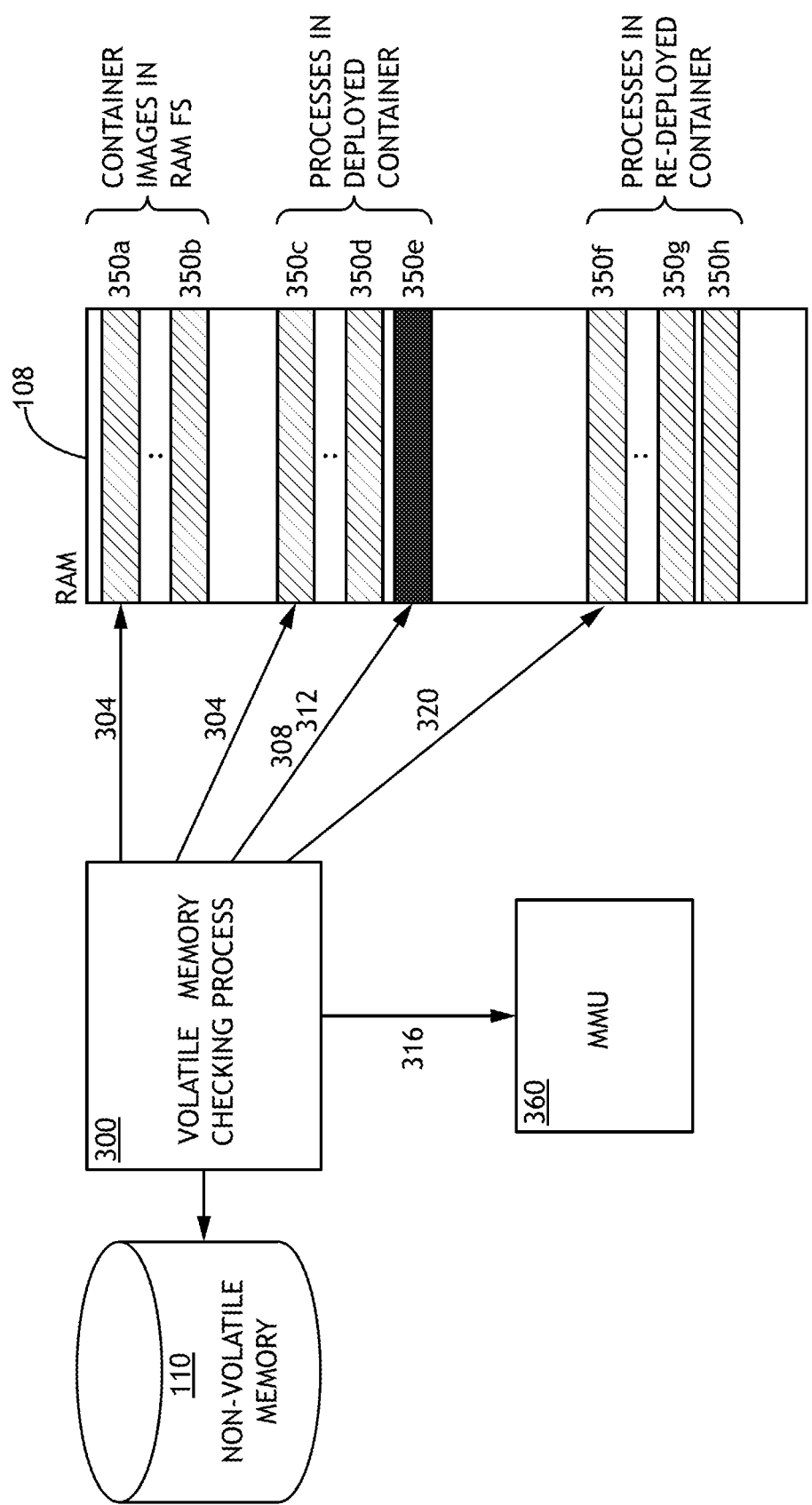
FIG. 3B is a bock diagram illustrating an error checking process, in accordance with one or more embodiments of this disclosure.

In embodiments, the volatile memory checking process 300 includes a step 304 of checking a first physical address space of the volatile memory 108 for errors, wherein the first address space stores a portion of the container. The volatile memory 108 is divided into a plurality of physical address spaces 350, (e.g., RAM blocks, as shown in FIG. 3B). A single container 216 may be loaded into one or more physical address spaces 350. For example, a container 216, or portion of the container 216 may be loaded into a first physical address space 350e (e.g., the container may be loaded into a cluster of physical address spaces 350 that includes the first physical address space 350e).

In embodiments, the containers 216 include digests and/or error correction coding as metadata that are loaded into the volatile memory 108 that may be used for error checking in step 304. For example, the containers 216 may include cryptographic hashes. In another example, the containers 216 may contain a cyclic redundancy check (CRC). In step 304, the one or more processors 106 may be instructed to check and verify the in-memory container images 224 that are loaded into the volatile memory (e.g., loaded into a RAM file system) as well as the executing container processes. Processes executing within a container can notify the checking process of detected digest or checksum failures in messages and internal data structures.

In embodiments, the volatile memory checking process 300 includes a step 308 of loading at least one or the container or a test pattern into volatile memory 108 that includes the first physical address space 350e when an error is determined in the first physical address space 350e. When an error is detected in volatile memory 108, the error may be a transient single-event upset that can be resolved by reloading the container 216 from the container image 224 stored in non-volatile memory 110. For example, the container 216 may be loaded into the same volatile memory block containing the first physical address space 350e. Due to the data loading protocols, first physical address space 350e may be reloaded with the same data from the container as loaded previously. However, it is possible that the first physical address space may be loaded with different data from the container as loaded previously (e.g., the container is reloaded into the same volatile memory block, but configured differently between the physical address spaces 350 that define the volatile memory block. Alternatively, a test pattern may be loaded into the first physical address space 350e in order to test the first physical address space for errors. In some embodiments, the container 216 is reloaded without rebooting the computing system. Loading a container 216 without a rebooting is an advantage for containerized systems, allowing continuous operation of the computing system 100 without costly delays or effort.

In embodiments, the volatile memory checking process 300 includes a step 312 of rechecking the first physical address space 350e for errors. Rechecking the first physical address space 350e involves testing volatile memory blocks, including the first physical address space 350e by writing and performing read-back of known patterns. For example, the first physical address space 350e that has been reloaded with the container 216 or a portion or the container 216 may be read-back to determine if the reloaded container 216 is an exact or near-exact copy of the container image 224. In another example, the first physical address space 350e that has been loaded with a test pattern may be read-back to determine if the loaded pattern is an exact or near exact copy of an image of the pattern. If upon rechecking, the first physical address space 350e does not present an error (e.g., the container 216 and/or test pattern was successfully read-back from the first physical address space 350e), then the volatile memory checking process 300 concludes, and the first physical address space 350e continues to be used as volatile memory 108 for the computation unit 102. (i.e., if the test pattern is validated, the container image 224 will be loaded to the first physical address space 350e). If upon rechecking, the first physical address space 350e presents an error (e.g., the container 216 and/or test pattern was not successfully read-back from the first physical address space 350e), then the volatile memory checking process 300 continues.

In embodiments, the volatile memory checking process 300 includes a step 316 of designating the first physical address space 350e as a faulty physical address space when an error is determined in the first physical address space 350e, updating a memory management unit 360 designating the first physical address space 350e as faulty and updating a memory management file stored in non-volatile memory 110 designating the first physical address space as faulty. The memory management unit 360 is a computer hardware unit (e.g., a processor 106) having all memory references passed through itself, primarily performing the translation of virtual memory addresses to physical addresses. The memory management unit 360 performs virtual memory management handling memory protection and bus arbitration. By updating the memory management unit 360 the computation unit 102 will no longer attempt to load software into the first physical address space 350e.

Along with updating the memory management unit 360 upon finding a fault in the first physical address space 350e, the memory management file stored in non-volatile memory will be updated as well. By updating the memory management file, the computation unit 102 will not attempt to load the container 216 into the first physical address space 350e when the computation unit 102 is rebooted.

In embodiments, the volatile memory checking process 300 includes a step 320 of loading the container 216 into a second physical address space 350h. For example, the first physical address space 350e and the second physical address space 350h may both be located on the same volatile memory unit (e.g., a memory chip). In another example, the first physical address space 350e and the second physical address space 350h may both be located on the separate volatile memory units (e.g., on separate chips).

FIG. 3B is a block diagram illustrating volatile memory checking process 300, in accordance with one or more embodiments of this disclosure. The volatile memory checking process 300 is orchestrated by the controller 104 via the one or more processors 106. The volatile memory 108 (e.g., RAM block) contain a plurality of physical address spaces 350a-h with physical address spaces 350c-e designated for the container 216, which was initially loaded form the non-volatile memory 110 that stored the container image 224. The volatile memory checking process 300 scanned the volatile memory 108 for errors (e.g., an error being found in the first physical address space 350e in FIG. 3B). If upon reloading the container image 234 or a test pattern into the block containing the first physical address space 350e, the error persists, the memory management unit 360 will be updated, as well as the memory management file, and the container 216 will be loaded into a different volatile memory block containing the second physical address space 350h.

Figure 4A:
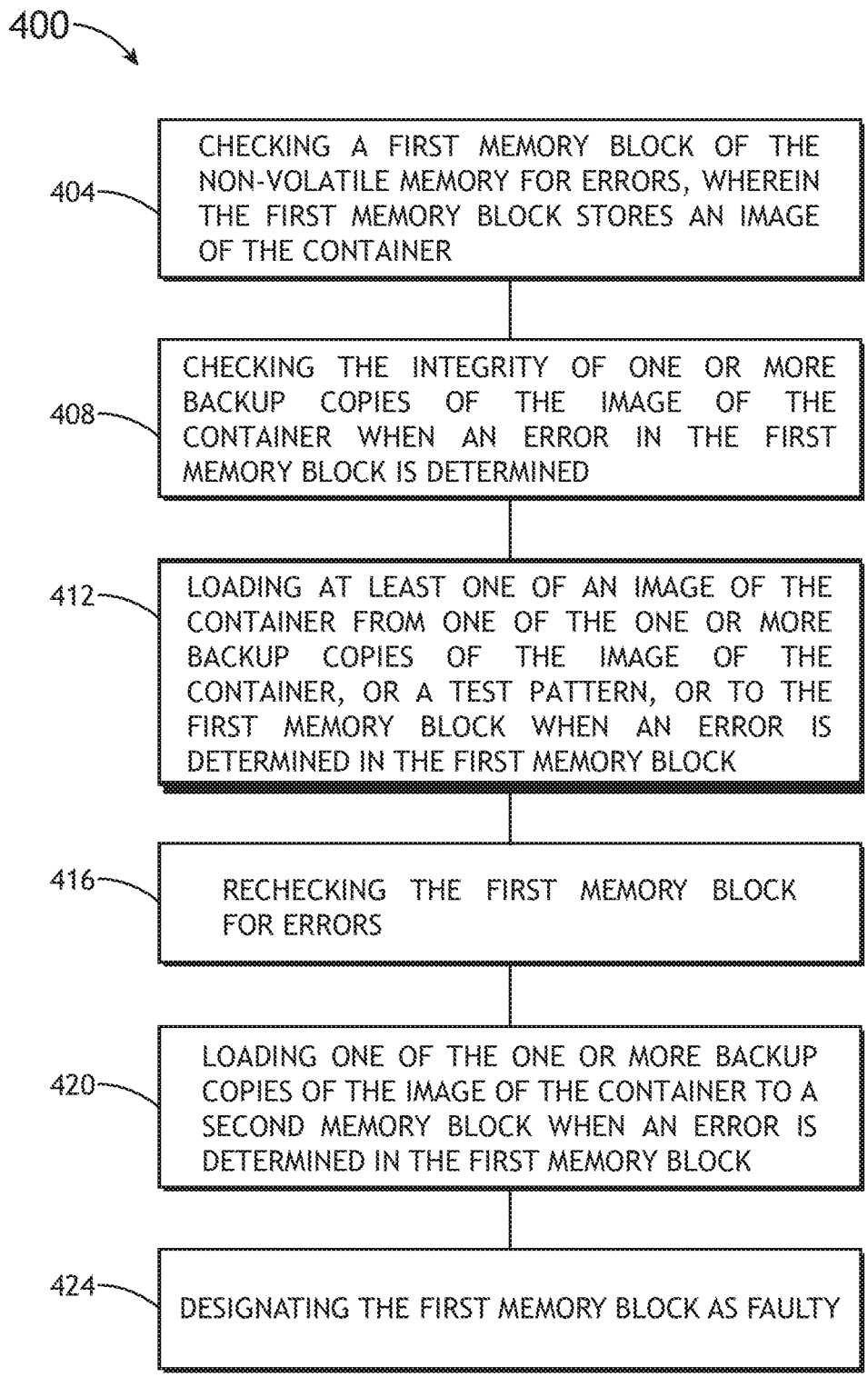
FIG. 4A is a flow diagram illustrating an error checking process, in accordance with one or more embodiments of this disclosure.

FIG. 4A is a flow diagram illustrating a non-volatile memory checking process 400 for the non-volatile memory 108 of the computing system 100, in accordance with one or more embodiments of this disclosure. The non-volatile memory checking process 400 is configured to periodically check container images 234 for errors. The errors may comprise soft errors (e.g., a single event upset) or a permanent error (e.g., a single-event gate rupture or single-event burnout). In some embodiments, the non-volatile memory checking process 400 is performed by the one or more processors 106 within the computation unit 102. For example, the non-volatile memory checking process 400 may be performed by one or more processors 106 operating within the same operating system (e.g., a primary operating system) and/or on the same core as the one or more processors 106 used for loading container images 234 onto volatile memory 108 within the computing system 100. In another example, the non-volatile memory checking process 400 may be performed by one or more processors 106 operating within a different operating system (e.g., a monitoring operating system) and/or core as the one or more processors 106 used for loading container images 234 onto volatile memory 108 within the computing system 100. For instance, the monitoring operating system and the primary operating system may compare data and/or signals sent to each other as a method to detect errors.

Figure 4B:
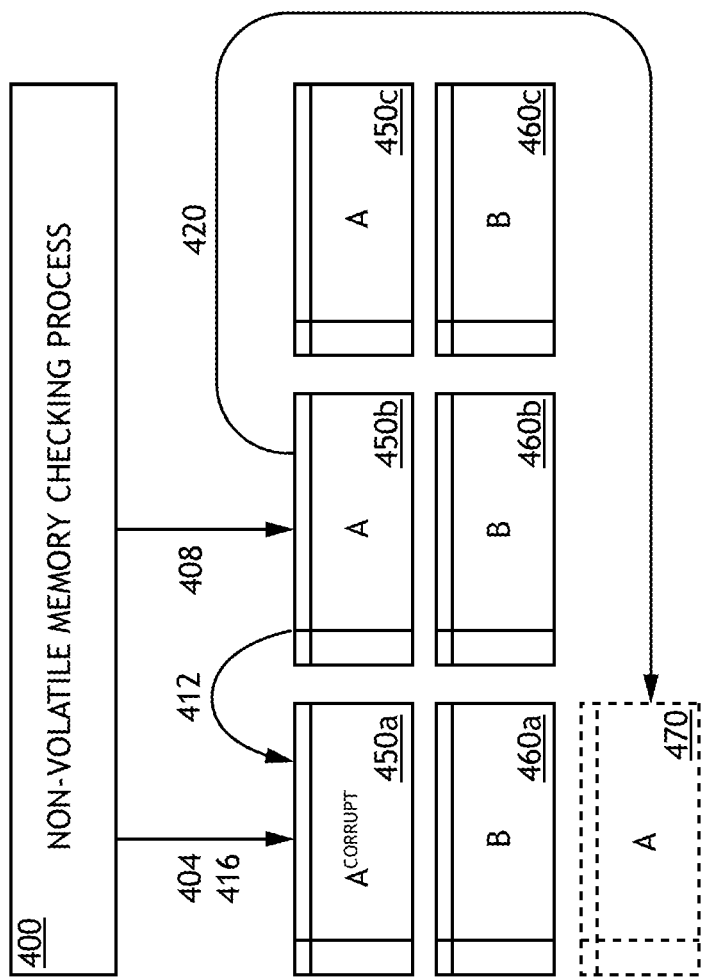
FIG. 4B is a block diagram illustrating an error checking process, in accordance with one or more embodiments of this disclosure.

In embodiments, the non-volatile memory 110 is configured as an array of non-volatile memory blocks 450, 460, 470 (e.g., as presented on FIG. 4B). The array is configured so that multiple copies of software (e.g., code and/or data) are loaded onto different memory blocks. This redundancy allows comparisons to be made between similar blocks of code in order to determine when a block of code is faulty.

In embodiments, the non-volatile memory checking process 400 includes a step 404 of checking a first memory block 450a of the non-volatile memory 110 for errors, wherein the first memory block 450a stores the container image 224. For example, one or more processors 106 may be instructed to scan container images 224 binaries, and other data items in non-volatile memory 110 periodically for errors. Checking for errors may include comparisons of multiple copies of container images 224 to each other (e.g., code redundancy). The computing system 100 may have any number of copies of container images 224 stored within the non-volatile memory 110. For example, the non-volatile memory may be configured to store three copies of the container image 224. In another example, the volatile memory may be configured to store five copies of the container image 224.

In embodiments, error correction coding is used to detect errors in the computer image 224. For example, components of the non-volatile memory 110 (e.g., files and/or blocks) may be stored with a digest (i.e. cryptographic hash) and/or cyclic redundancy check with which the process can verify the integrity of the file and/or block in non-volatile memory. In embodiments, error correction coding may be combined with memory redundancy or error detection. For example, a voting logic, based on the comparison of multiple copies of the container image 224 (e.g., or files and/or blocks within the container), may be used along with a cyclic redundancy check to determine if a container image is stored within a faulty or non-faulty block.

In embodiments, the non-volatile memory checking process 400 includes a step 408 of checking the integrity of one or more backup copies of the container image 234 when an error in the first memory block 450a is determined. For example, one of more memory blocks 450 storing the container image 224 may be tested for integrity. For instance, the one or more memory blocks 450 storing the container image may be compared to each other, with the integrity of a memory block verified through voting logic. In another instance, container correction coding (e.g., a cyclic redundancy check) may be used to determine integrity of the backup memory. In another instance both comparison of redundant backup memories and container correction coding may be combined to determine integrity of the backup memory.

In embodiments, the non-volatile memory checking process 400 includes a step 412 of loading at least one of a container image 224 from one of the one or more backup copies of the image of the container, or a test pattern, to the first memory block 450a when an error is determined in the first memory block 450a. The test pattern may include any test pattern known configured to determine fidelity of non-volatile memory 110.

In embodiments, the non-volatile checking process 400 includes a step 416 of rechecking the first memory block 450a for errors. For example, rechecking the first memory block 450a for errors may include testing a loaded test pattern loaded into the first memory block 450a for fidelity. In another example, rechecking the first memory block 450a may include comparing the loaded container image 224 to other redundant container images 224 stored in non-volatile memory 110. In another example, rechecking the first memory block 450a may include the use of container correction coding (e.g., a cyclic redundancy check). In another example, rechecking the first memory block 450a may include comparing the loaded container image 224 to other redundant container images 224 stored in non-volatile memory 110 in combination with the use of container correction coding. If, after rechecking, a container image 224 loaded into the first memory block 450a is validated (e.g., determined to not be corrupted), the non-volatile memory checking process 400 halts. Correspondingly, if a test pattern loaded into a first memory is validated, the non-volatile memory checking process halts, and a container image 224 from a redundant memory block is loaded into the first memory block 450a.

In embodiments, the non-volatile memory checking process 400 includes a step 420 of loading one of the one or more backup copies of the container image 224 to a second memory block 470 when an error is determined in the first memory block 450e. For example, the container image 234 may be copied to a second memory block 470 disposed within the same array of memory blocks. In another example, the container image may be copied to a second memory block 470 disposed on a separate storage unit (e.g., a separate memory chip or flash storage drive).

In embodiments, the non-volatile memory checking process 400 includes a step 424 of designating the first memory block 450e as faulty. For example, a non-volatile memory management file may be created that tracks faulty non-volatile memory blocks. By updating the memory management file, the computing system 100 will avoid loading container images 224 and other files and/or data into faulty non-volatile memory blocks. In some embodiments, the step 424 of updating the non-volatile memory management file is performed is without the step 420 of loading the one or more backup copies of the container image 224 to a second memory block 470 (i.e., the first memory block 450e is labeled as faulty and no other action is taken)

FIG. 4B is a block diagram illustrating the non-volatile memory checking process 400, in accordance with one or more embodiments of this disclosure. The non-volatile memory checking process 400 is orchestrated by the controller 104 via the one or more processors 106. The non-volatile memory 110 contains a plurality of non-volatile memory block 350, 360, 370. Some blocks store redundant copies of files/data. For example, non-volatile memory blocks 450a-c contain copies of the container image 224 (e.g., represented by the letter 'A'), while other non-volatile memory blocks 460a-c serve other purposes (e.g., represented by the letter B'). In the example, the first non-volatile memory block 450a was scanned and found to have a corrupt container image 224 through comparisons with container images 224 form backup non-volatile memory blocks 450b, 450c and/or container code correction. In the example, the container image 224 is then loaded into the first non-volatile memory block 450a, but is still found to have a corrupt container image after further testing. To ensure that redundancy of non-corrupted container images is maintained. The container image 224 from one of the backup non-volatile memory blocks 450b is copied to a second non-volatile memory block 470.

The volatile memory checking process 300 scanned the volatile memory 108 for errors (e.g., an error being found in the first physical address space 350e in FIG. 3B). If upon reloading the container image 224 or a test pattern into the block containing the first physical address space 350e, the error persists, the memory management unit 360 will be updated, as well as the memory management file, and the container 216 will be loaded into a different volatile memory block containing the second physical address space 350h.

In embodiments, the one or more processors 106, collectively or independently within the computing system 100 may be configured to perform both the volatile memory checking process 300 and the non-volatile memory checking process 400.

In embodiments, the containers 216, binaries, and other data items (e.g., executables) that are stored in a non-volatile memory 110 are stored along with metadata that defines checking (e.g., scanning) priority. For example, a manifest stored in non-volatile memory 110 may be used to determine checking priority. This allow prioritizing checking of important and/or vulnerable items more often than less important and/or vulnerable items. Several methods for determining the priority for checking data are possible. For example, a container may be purposefully injected with one or more random faults to see how often the container becomes no longer functional. In another example, faults that occur in code for maintaining statistics, logging, and debugging, and other functions may not cause disruptions in processor functionality, suggesting that non-volatile memory that stores these functions may have a low priority for checking. In another example, faults that occur within the computing system may be tracked in real-time, for which statistics these tracked faults may be used for determining checking priority.

In some embodiments, the method for determining checking priority may include adjusting the checking priority based on the environment of the computing system 100. For example, a computing system 100 disposed within a radio on a satellite in high earth orbit would be expected to have a higher incidence of faults than a similar satellite radio system in a low earth orbit. Therefore, the computing system 100 in the high earth orbit may have a higher checking priority and is checked more often than the computing system 100 in the low earth orbit.

In some embodiments, the method for determining checking priority may include configuring processors to relocate containers 216 to different non-volatile memory components as a method of heat management. Hotter components fail more often than cooler components. By rotating higher processing intensive containers periodically, heat may be balanced within the computing system 100.

In some embodiments, computing systems 100 that utilize a monitoring operating system and/or processing core for running the volatile memory checking process 400 are configured to send signals (e.g., heartbeats, digest, and/or known-answers) back and forth between the monitoring operating system and the primary operating system, which are verified against a manifest. When the monitoring operating system detects a failure, the monitoring operating system can redeploy the containers and binaries running on the primary operating system to another core or processor 106 and disable the primary operating system core. When the primary operating system detects a failure, the primary operating system can redeploy the monitoring operating system to another core or processor. If enough failures occur, the primary operating system or monitoring operating system can reboot the computing system (e.g., reboot the transceiver).

In some embodiments, memory (e.g., volatile memory 108 and/or non-volatile memory 110) utilized in a message buffer is checked for errors using at least one or the volatile memory checking process 300 or the non-volatile memory checking process 400). For example, message digests, checksums, and cyclic redundancy checks may be utilized for inter-processor, inter-process and intra-process messaging to ensure integrity. Upon failure of integrity verification, a prioritized message may be re-sent using another message transport method.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein. Additionally, one or more steps within a process or method may be repeated. For example, one or more steps within the volatile memory checking process 300 or the non-volatile memory checking process 400 may be repeated in order to identify a faulty physical address space 350 of volatile memory 108 or non-volatile memory block 450.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:
1. A computing system comprising:
a computation unit on-board a low earth orbit satellite configured to resolve single-event upsets in a volatile memory, comprising:
one or more one processors;
the volatile memory; and
a non-volatile memory communicatively coupled to the one or more processors and having instructions stored, which when executed by the one or more processors, causing the one or more processor to:
instantiate a container upon the volatile memory, wherein the container is configured as a self-contained architecture that includes a parsed component of an application, and metadata, wherein the metadata contains at least one of a digests or error correction coding; and
perform a volatile memory checking procedure to check the volatile memory for an error, the volatile memory checking procedure comprising:
checking a first physical address space of the volatile memory for the error, wherein the first address space is configured to store a portion of the container, wherein checking a first physical address space includes at least one of detecting the digest or a checksum based on the error correction coding;
loading at least one of the container or a test pattern into volatile memory that includes the first physical address space when the error is determined in the first address space;
rechecking the first physical address space for errors;
designating the first physical address space as a faulty physical address space when the error is determined in the first physical address space comprising:
updating a memory management unit corresponding to the first physical address space designating the first physical address space as faulty; and
updating a memory management file stored in non-volatile memory designating the first physical address space as faulty; and
loading the container into a second physical address space.

2. The computing system of claim 1, further comprising a transceiver communicatively coupled to the computation unit.

3. The computing system of claim 1, wherein the container is a component of a microservice architecture.

4. The computing system of claim 1, wherein checking the first physical address space of the volatile memory for the error comprises a cyclic redundancy check.

5. The computing system of claim 1, wherein reloading the container into the first physical address space occurs without rebooting the computing system.

6. The computing system of claim 1, wherein the computing system is ruggedized against single-event effects.

7. The computing system of claim 1, wherein the first physical address space and the second physical address space are located on separate volatile memory units.

8. The computing system of claim 1, wherein the computation unit is nonhardened against single-event effects.

9. A computing system comprising:
a computation unit on-board a low earth orbit satellite configured to resolve single-event upsets in a volatile memory, comprising:
one or more processors;
the volatile memory; and
a non-volatile memory communicatively coupled to the one or more processors and having instructions stored thereon, which when executed by the one or more processors, causing the one or more processor to:
instantiate a container upon the volatile memory, wherein the container is configured as a self-contained architecture that includes a parsed component of an application, and metadata, wherein the metadata contains at least one of a digests or error correction coding; and
perform a non-volatile memory checking procedure to check the non-volatile memory for an error, the non-volatile memory procedure, comprising:
checking a first memory block of the non-volatile memory for the error, wherein the first memory block stores an image of the container, wherein checking a first memory block includes at least one of detecting the digest or a checksum based on the error correction coding;
checking an integrity of one or more backup copies of the image of the container when the error in the first memory block is determined;
loading at least one of the image of the container from one of the one or more backup copies of the image of the container, or a test pattern, or to the first memory block when the error is determined in the first memory block;
rechecking the first memory block for the error;
loading one of the one or more backup copies of the image of the container to a second memory block when the error is determined in the first memory block; and
designating the first memory block as faulty.

10. The computing system of claim 9, further comprising a transceiver communicatively coupled to the computation unit.

11. The computing system of claim 9, wherein the container is a component of a microservice architecture.

12. The computing system of claim 9, wherein checking a first memory block of the non-volatile memory for the error comprises a cyclic redundancy check.

13. The computing system of claim 9, wherein checking a first memory block of the non-volatile memory for errors further comprises a use of a voting logic.

14. The computing system of claim 9, wherein the computing system is ruggedized against single-event effects.

15. The computing system of claim 9, wherein the computation unit is nonhardened against single-event effects.

* * * * *